(12) United States Patent
Yoshio et al.

(10) Patent No.: US 6,555,158 B1
(45) Date of Patent: Apr. 29, 2003

(54) METHOD AND APPARATUS FOR PLATING, AND PLATING STRUCTURE

(75) Inventors: Akira Yoshio, Tokyo (JP); Yuji Segawa, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/487,828

(22) Filed: Jan. 20, 2000

(30) Foreign Application Priority Data

Jan. 22, 1999 (JP) .......................................... 11-013845

(51) Int. Cl.[7] .............................. B05D 7/22; B05D 1/18; B05D 5/12; B05D 3/02; B05D 3/10
(52) U.S. Cl. ........................... 427/97; 427/98; 427/230; 427/240; 427/304; 427/305; 427/383.1; 427/437; 427/438; 427/443.1
(58) Field of Search ........................ 427/97, 98, 230, 427/304, 305, 383.1, 240, 437, 438, 443.1; 438/675, 678, 687

(56) References Cited

U.S. PATENT DOCUMENTS

| | | |
|---|---|---|
| 3,011,920 A | 12/1961 | Shipley, Jr. |
| 4,169,171 A | 9/1979 | Narcus |
| 4,532,152 A * | 7/1985 | Elarde .......................... 427/96 |
| 4,976,990 A * | 12/1990 | Bach et al. .................... 427/98 |
| 5,178,682 A | 1/1993 | Tsukamoto et al. |
| 5,446,330 A * | 8/1995 | Eda et al. ............... 310/313 R |
| 5,674,787 A | 10/1997 | Zhao et al. |
| 5,696,207 A | 12/1997 | Vargo et al. |
| 5,705,230 A * | 1/1998 | Matanabe et al. .......... 427/438 |
| 5,837,662 A | 11/1998 | Chai et al. |
| 6,136,095 A * | 10/2000 | Xu et al. .................... 118/719 |

FOREIGN PATENT DOCUMENTS

| | | |
|---|---|---|
| EP | 0 506 993 | 10/1992 |
| JP | 58-190025 | * 11/1983 |
| JP | 58190025 | 11/1983 |
| JP | 62287081 | 1/1987 |
| JP | 04074870 | 3/1992 |
| JP | 93-101974 | 4/1993 |
| WO | 84/01392 | 4/1984 |
| WO | WO 97/22419 | * 6/1997 |
| WO | 97/22733 | 6/1997 |
| WO | WO 97/46326 | * 12/1997 |

OTHER PUBLICATIONS

Lee C –Y et al.: "Diffusion Barrier Properties of Electroless NI for Electroless CU Using CU Plating Employing Hypophosphite as a Reducing Agent"; Journal of Materials Science: Materials in Electronics, GB, Chapman and Hall, London, vol. 9, No. 5, Oct. 1998; pp. 337–346.

* cited by examiner

Primary Examiner—Michael Barr
(74) Attorney, Agent, or Firm—Rader, Fishman & Grauer PLLC; Ronald P. Kananen, Esq.

(57) ABSTRACT

There is a method and apparatus for plating in which electroless copper plating is performed in a contact hole and an interconnect trench on a minute scale of a semiconductor integrated circuit device, and a plating structure. Organic material originated from an organic gas carried over from the preceding step is removed from the inner surface of a blind hole, thereafter the surface of the barrier layer is subjected to predetermined pretreatments comprising a hydroxylation treatment, a coupling treatment, a Pd colloidal solution treatment and the like, and following the pretreatments, electroless plating with copper is effected desirably under influence of ultrasonic waves. Hence, a uniform, good quality plating layer is formed inside and outside the hole and a CMP processing following the plating is performed with ease.

30 Claims, 7 Drawing Sheets

METHOD AND APPARATUS FOR PLATING, AND PLATING STRUCTURE

FIELD OF THE INVENTION

The present invention relates to a method and apparatus for plating, and a plating structure and for example, to a method and apparatus that are preferable for forming a copper interconnection in a contact hole or an interconnect trench, and an interconnect structure in a semiconductor integrated device.

BACKGROUND OF THE INVENTION

Al (aluminum) interconnects have conventionally been formed in fine contact holes or interconnect trenches of a high density integrated circuit fabricated on a semiconductor wafer (hereinafter referred to as wafer). The Al interconnects, however, have exposed a tendency to be increasingly replaced with Cu (copper) interconnects because of its limited resistance to electromigration. As Cu interconnection techniques in the contact holes and interconnect trenches, a so called Damascene approach that comprises a process in which Cu interconnection material is filled into the openings by electroplating and unnecessary portions of the interconnection material are removed by polishing using a CMP (Chemical Mechanical Polishing) technique has been regarded as having great promise in the future for reduction in manufacturing cost of a semiconductor device since there is no need to fill spaces between interconnects with an interlayer insulating film. Further, an interconnect can be formed in an opening with a high aspect ratio.

FIGS. 1 to 4 are sectional views schematically showing a copper interconnection process by means of a Damascene technique (here, a dual Damascene technique).

That is, in the process shown in the figures, insulating layers 34 and 35, such as layers made of $SiO_2$, are stacked on copper interconnects 32a and 32b (on whose upper and lower surface barrier layers 33 are provided) which are formed on a wafer 31 by etching or the like. Thereafter, a contact hole 36 and interconnect trenches 37 are formed by etching or the like and copper interconnects are formed by electroplating copper which constitutes as interconnection material. In the interconnection process, a seed layer 39 that serves as nuclei for plating is formed in the contact hole 36 and interconnect trench 37 as shown in FIG. 2 after a barrier layer 38 is formed as shown in FIG. 1. Following formation of the seed layer, a copper electroplating layer 40 is formed as shown in FIG. 3 (which is an enlarged sectional view of a region in the vicinity of the contact hole 36 of FIG. 2) and the electroplating layer 40 is polished off to form an copper interconnect 43 in the contact hole 36 as shown in FIG. 4. In addition, a copper interconnect similar to that in the contact hole 36 is simultaneously formed in the interconnect trench 37 as well.

However, a recess 42 and a seam 41 are apt to occur respectively on and in the interconnect as shown in the figures. Associated with this phenomenon, there arise problems such as items (1) to (4) which will be shown as follows: (1) Since an electroplating film is deposited on the surface of the wafer 31 and, especially, in the vicinity of the mouth of the blind hole (contact hole) 36 with priority assigned thereto, there arise limitations that the minimum of a diameter D of the blind hole 36 is 0.25 μm and the highest aspect ratio thereof is of the order of 5. (2) Filling by electroplating into the blind hole 36 is possible by selecting an effective combination of additives. However, when the additives are selectively combined so as to electroplate a small diameter blind hole, an almost flat surface finish is obtained in a wide mouthed trench, whereas a swollen surface finish is formed at the top of a small diameter blind hole; that is, a flat surface finish is hard to acquire in a small diameter blind hole, which entails more difficulty in planarization by CMP. (3) As shown in FIG. 2, when the seed layer 39 is formed, the seed layer 39 is not formed on the sidewall of the blind hole 36 in a uniform thickness, but rather the layer 39 is apt to be formed thick on the upper surface and areas in the vicinity of the respective mouths of the blind hole 39 and interconnect trench 37. Such spatial thickness distribution of the seed layer 39 with a large dispersion, in turn, is a cause for a spatial thickness dispersion in electroplating. (4) Further, when electroplating is performed in an apparatus of a rotary electrode type, a thickness variation along a diameter is recognized: the state is such that an 8 inch diameter wafer has a variation of the order of 3% and a 12 inch diameter wafer has a variation of the order of 5%, which acts as a difficult factor in globally uniform planarization across the entire surface of a wafer.

OBJECTS AND SUMMARY OF THE INVENTION

It is accordingly an object of the present invention to provide a method and apparatus for plating with high productivity by means of which plating an interconnection with uniformity, high quality and high planarity can be achieved even in a hole with a high aspect ratio and over a large area plating region, and a plating structure.

According to one aspect of the present invention, there is provided a method for plating in which at least a hole is plated with a metal, comprising: a first step of removing organic material existent in a plating region; a second step of hydrophilizing a surface of the plating region after the first step; a third step of bonding a coupling agent with the surface hydrophilized by the second step; a fourth step of bonding a catalytic metal with the coupling agent at the surface after the third step; a fifth step of exposing the catalytic metal to activate after the fourth step; and a sixth step of electrolessly plating the activated surface after the fifth step.

According to a method for plating of the present invention, when at least a hole, such as a blind hole, is plated as a plating region, since organic material existent in a plating region is removed and the surface is hydrophilized, further a catalytic metal is bonded with a coupling agent that is bonded with the surface, and the surface is exposed, activated and then electrolessly plated, plating is effected uniformly at the mouth, bottom and sidewall of the hole and further no seed layer is required, which is different from a conventional electroplating. Hence, not only a flat surface but a hole with a high aspect ratio can be plated in a uniform manner with a good quality and in addition, a plating layer with high flatness can be formed at the top part of the hole. Therefore, polishing following the plating is easy to be effected and electroless plating can be conducted directly after the polishing without either physical surface roughening or a heat treatment (see JP 93-101974 A), thereby enabling a method for plating with high productivity to be provided.

According to another aspect of the present invention, there is provided an apparatus for plating in which at least a hole is plated with a metal, comprising: a pretreatment section which performs a first step of removing organic material existent in a plating region, a second step of hydrophilizing a surface of the plating region after the first step, a third step of bonding a coupling agent with the surface hydrophilized by the second step, a fourth step of bonding a catalytic metal with the coupling agent at the surface after the third step, and a fifth step of exposing the catalytic metal to activate after the fourth step; and an electroless plating section which performs a sixth step of electrolessly plating the activated surface after the fifth step. According to the present invention, there can be provided an apparatus for electroless plating with good reproducibility since the apparatus is based on the above described method for plating, which apparatus comprises the pretreatment section and electroless plating section.

According to still another aspect of the present invention, there is provided a plating structure that is formed by plating at least a hole with a metal, wherein a coupling agent is bonded with a hydroxylated surface of a plating region, a catalytic metal is bonded with the coupling agent and an electroless plating layer is formed on the surface with the catalytic metal interposed therebetween. According to the present invention, since an electroless plating layer is formed based on the method for plating, an excellent plating structure is provided.

DESCRIPTION OF THE PREFERRED EMBODIMENTS

Figure 1:
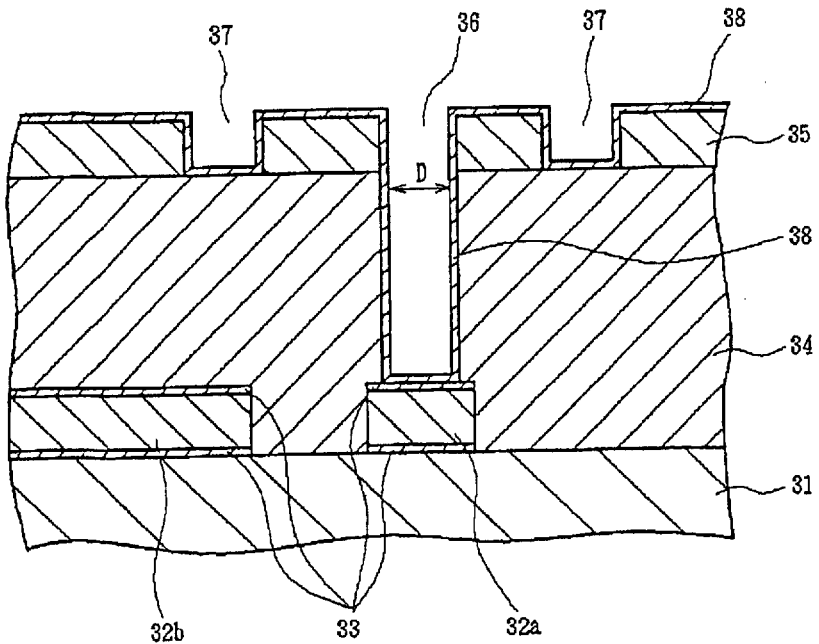
FIG. 1 is a sectional view schematically showing a step of electroplating according to a conventional example.
Figure 2:
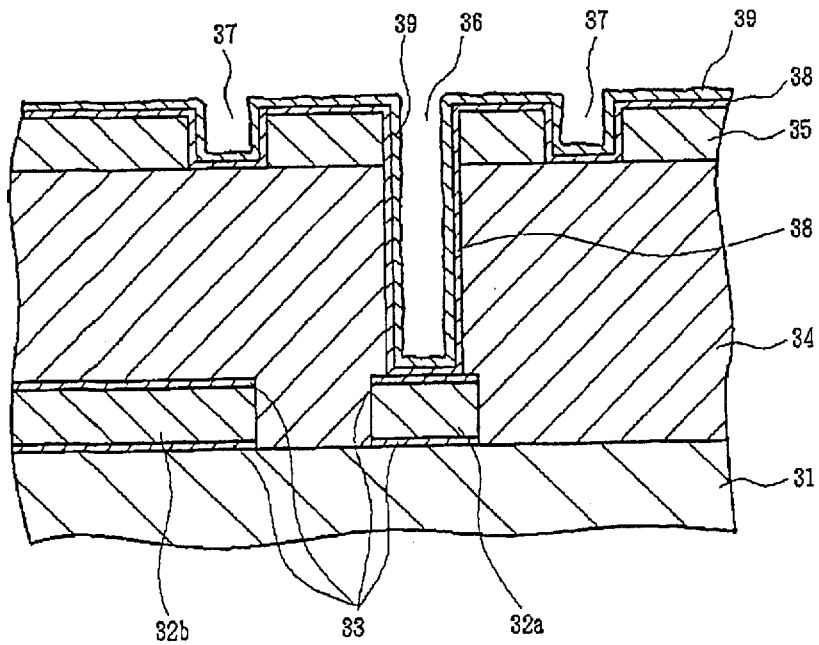
FIG. 2 is a sectional view schematically showing another step of electroplating according to the conventional example.
Figure 3:
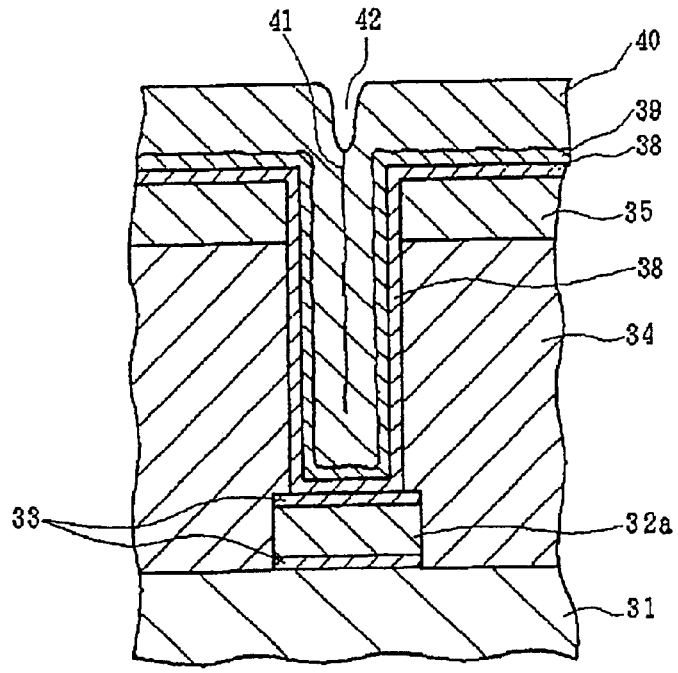
FIG. 3 is a sectional view schematically showing still another step of electroplating according to the conventional example.
Figure 4:
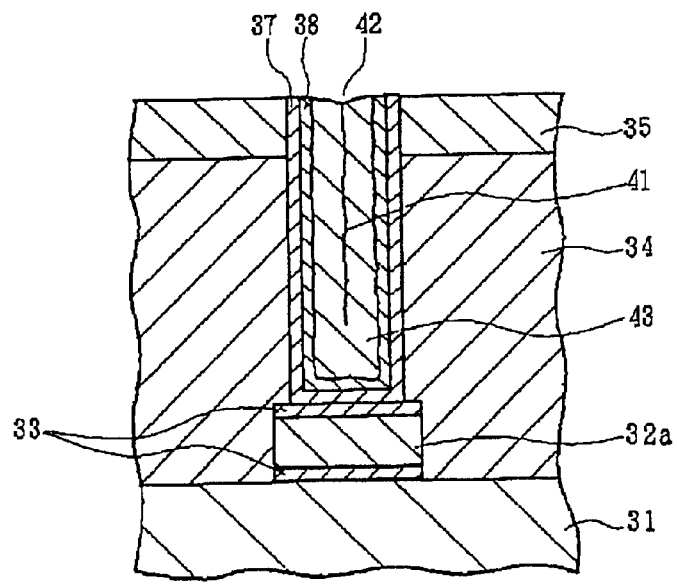
FIG. 4 is a sectional view schematically showing a further step of electroplating according to the conventional example.
Figure 5:
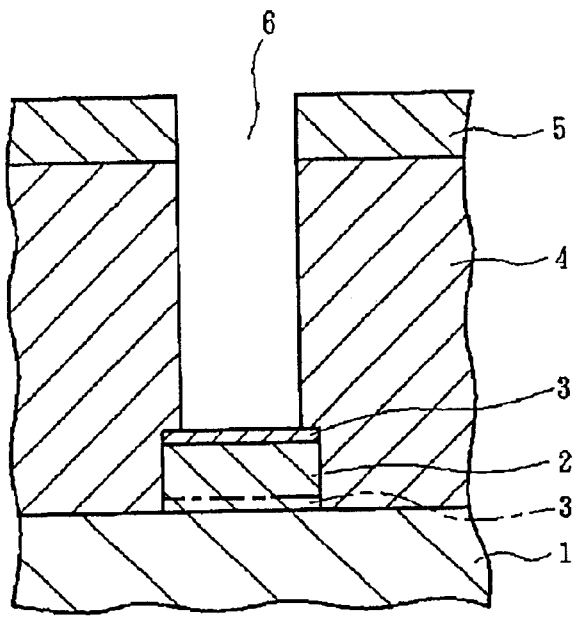
FIG. 5 is a sectional view schematically showing a step of electroless plating according to an embodiment of the present invention.
Figure 6:
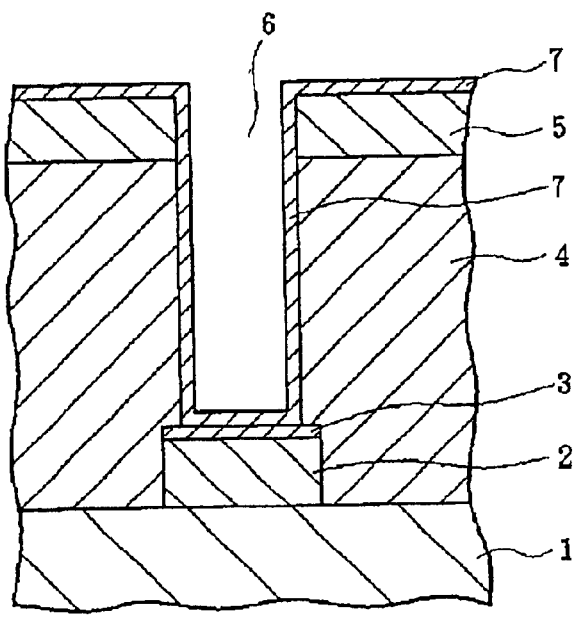
FIG. 6 is a sectional view schematically showing another step of electroless plating according to the embodiment of the present invention.

Below, description will be given of preferred embodiments of the present invention with reference to the accompanying drawings:

Describing about the surfaces of a plating region in a method and apparatus for plating and a plating structure according the present invention, tantalum nitride as barrier layers 3 and 7 are respectively provided, in advance, on the surface of a copper interconnect 2 at the bottom of a hole 6 that serves as a contact hole (in addition, likewise, another barrier layer 3 is provided on the lower surface thereof, which is shown with an imaginary line, and which will not be shown in the following figures), as shown in FIG. 5, and on the surface of the sidewall of the hole 6 and an insulating film 5 as shown in FIG. 6. Contaminating materials classified into organic material originating from an organic gas included in a small amount in the air inside a vacuum apparatus or/and a clean room used in a previous process are in many cases adsorbed on the barrier layers as a monomolecular film. Therefore, it is desired that after the barrier layer 7 constituted of tantalum or its compounds, for example tantalum nitride, is formed on the surface of at least the hole, the surface of the barrier layer is oxidized in order to remove the organic material, as a pretreatment. It is further desired that subsequent to the treatments, the surface is treated with an oxidizing agent to be hydroxylated; following the hydroxylation, the hydroxylated surface is reacted with a silane coupling agent or a titanate coupling agent including an atom or an atomic group that is easy to form a coordinate bond with a metallic component of a protective agent for a colloid of a catalytic metal. The resulting surface of the reaction is treated with a colloidal solution of the catalytic metal to have the metal component in the protective agent for the colloid of the catalytic metal to form a coordinate bond with a functional group of the silane coupling agent or titanate coupling agent. After treatment with the colloidal solution, the protective agent in excess that remains without formation of the coordinate bond is removed to expose the catalytic metal and activate the metal. Finally, the activated surface is treated with an electroless plating solution including a chelating agent and a reducing agent without alkali metal therein thereby, completing electroless plating with copper or nickel.

Figure 10:
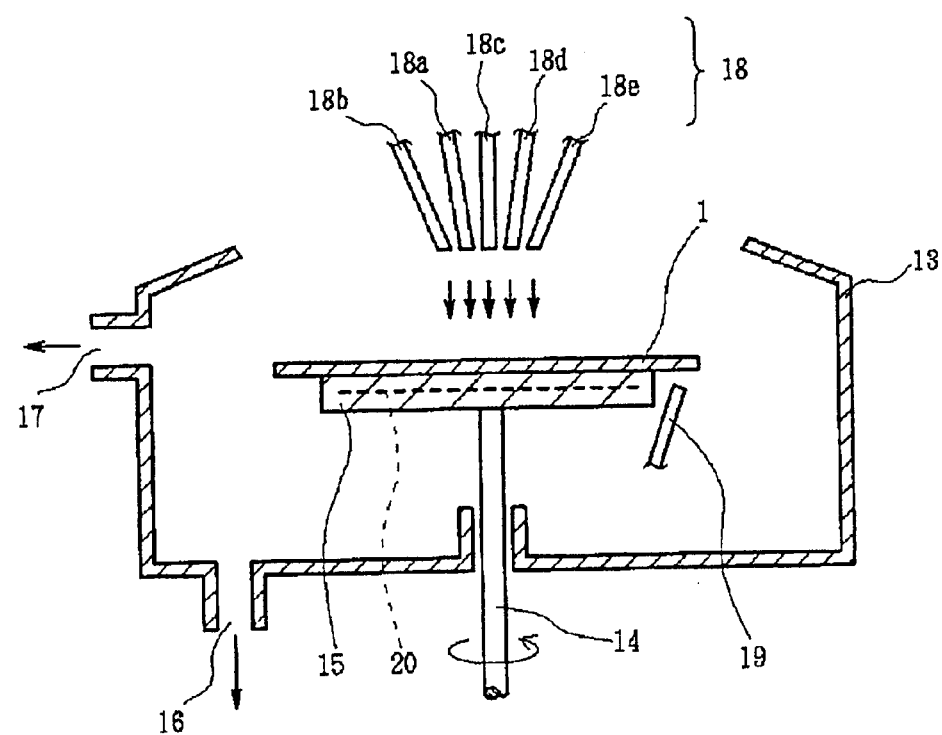
FIG. 10 is a sectional view schematically showing an example of an apparatus for electroless plating according to an embodiment of the present invention.
Figure 11:
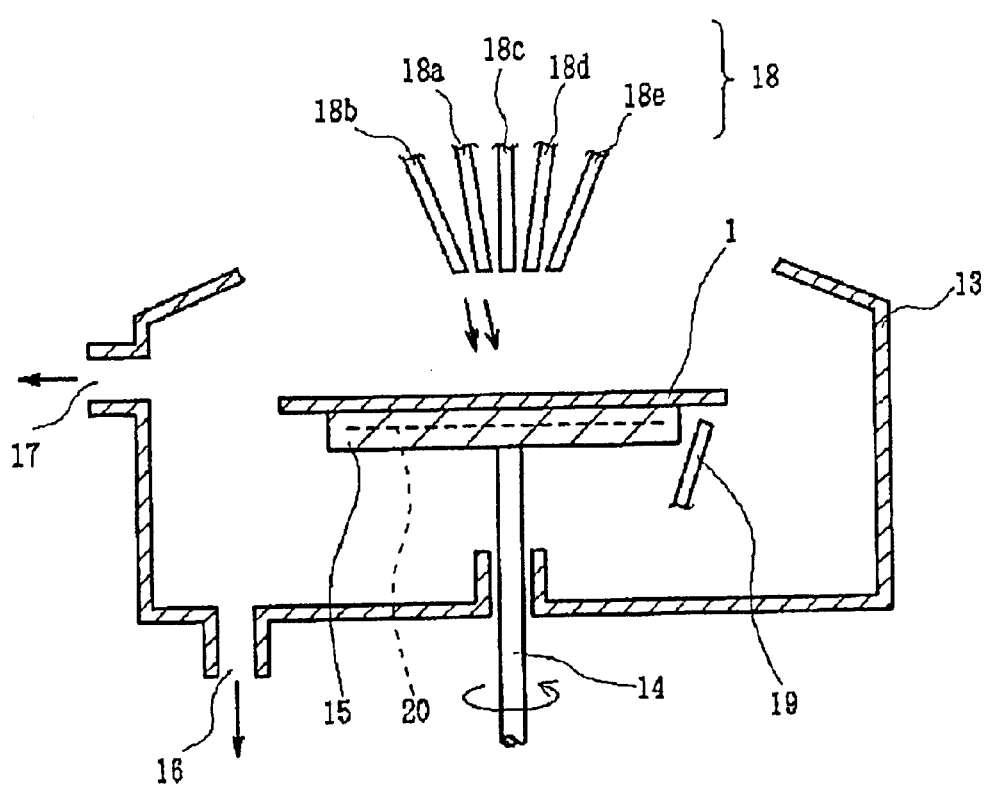
FIG. 11 is a sectional view schematically showing another example of an apparatus for electroless plating according to the embodiment of the present invention.

Since no contaminating organic material film more than one molecule thick, as a basic nature, attaches on the surfaces of wafers in actual device production, a process is only required in which a wet treatment is given to the wafer using an ozone/water mixture of 0.5 PPM or more in ozone concentration and preferably, in the range of 5 to 15 PPM in ozone concentration at room temperature at a flow rate in the range of 1 to 30 1/min for a time in the range 10 sec to 20 min in a spin cup as shown on FIGS. 10 and 11, as a removal treatment for the attaching organic material on the barrier layer. In the wet treatment, a form of a nozzle is not specific and if ultrasonic waves are applied to the ozone/water mixture through a running water ultrasonic nozzle whose wet surface portion is constituted of PTFE (polytetrafluoroethylene), stainless, titanium or the like, the wet treatment is more effective and a treatment time can be reduced. In addition to the above described treatment, the removal of an organic material contaminant may be effected, as a pretreatment, by a dry treatment such as an ozone treatment under ultraviolet irradiation, oxygen plasma ashing treatment and others.

In the above described hydroxylation, the surfaces of the barrier layer 7 and the metal or/and its compound constituting of the interconnect at the bottom of the hole 6, which are shown in FIG. 6, are oxidized in water, thereby the surfaces are hydrophilized and —OH groups are effectively formed on the surfaces. Hence, if the hydroxylation treatment is an ozone/water mixture treatment, it is most desirable that the hydroxylation treatment and the organic material removal treatment occur concurrently. However, when the organic material removal treatment is of the dry type, as the hydroxylation treatment, any material may be used or any treatment may be adopted as far as the material or the treatment has a capability of oxidize a metal or its compound constituting a barrier layer. The hydroxylation treatment is exemplified as follows: an ozone/water mixture treatment similar to the treatment in the organic material removal treatment, a sulfuric acid/hydrogen peroxide treatment, a hypochlorous acid treatment, an ammonium permanganate treatment and others.

A treatment in which the —OH group that is formed in the hydroxylation treatment and a coupling agent are reacted with each other to form a chemical bond may be effected using a silane coupling agent or a titanate coupling agent, which is most desirably adopted since the coupling agents have a capability of forming a coordinate bond with tin which protects a Pd colloidal catalyst that is used in the next process, by an amino group and a thiol group located in a hydrocarbon molecular chain or/and at the opposite end from an Si atom or a Ti atom in the hydrocarbon molecular chain of the coupling agents. Further, the surface that has been treated by a silane coupling agent or a titanium coupling agent has a surface irregularity of recess/projection corresponding to a size of a bonded molecule of a coupling agent and thereby is made rough as much. Therefore, the coupling treatment can be said to have sufficiently been performed if the coupling agent treated surface can retain a hydrophilicity at a level at which a colloidal catalytic metal used in the next process is adsorbed on the treated surface. Such silane coupling agent and titanium coupling agent are represented by compounds that have a group such as —OH group, —COOH group or —OR group, wherein R indicates an alkyl group, in the molecular chain or at an end thereof.

It is desired that a tin atom of stannous chloride which is a protective agent for the Pd colloid is reacted with an amino group or a thiol group in the silane coupling agent or the titanate coupling agent to form a coordinate bond by a treatment using a colloidal solution of a catalytic metal protected by stannous chloride, for example palladium (hereinafter also referred to as Pd), thereby making the palladium colloid bonded with the surfaces. That is, the Pd colloidal solution which is protected by stannous chloride is made to act on the wafer 1 which has been treated by the above described coupling agent and thereby, the tin atoms in the Pd colloid can react with the amino groups or thiol groups of the silane coupling agent or the titanate coupling agent on the wafer 1 to form coordinate bonds and as a result, attain strong bonds of Pd colloid with the surface.

In this case, any type of Pd colloidal catalyst can be adopted if the catalyst is like, Catalyst 9F made by Shipley Co., Ltd. However, since the Pd colloidal catalyst is used in a semiconductor process, a Pd colloidal catalyst whose protective agent is stannous chloride is preferred.

Excess stannous chloride that is not participated in coordinate bond with the surface of the wafer 1 is removed through cleaning by an aqueous solution such as one of $HBF_4$ (boron fluoride) or $H_2SO_4$ (sulfuric acid) to expose Pd, thus completing a pretreatment. An activating agent including $HBF_4$ like Accelerator 19 made by Shipley Co., Ltd. is most preferred for cleaning/removal in terms of quality and performance. On the other hand, a sulfuric acid based activating agent like Accelerator 240, which is similar to Accelerator 19, is more preferred since the activating agent is better from the viewpoint of environmental protection, although the agent is somewhat problematic in terms of quality and performance.

When the Pd colloidal solution is made simply to act on the wafer 1, the Pd colloid is only adsorbed on the wafer 1. Hence, in this situation, there arises a problem that the activation treatment cannot be performed by applying ultrasonic waves, since Pd is removed if ultrasonic treatment is applied. However, when a wafer is pretreated with a silane coupling agent or a titanate coupling agent including —$NH_2$ group or —SH group, as described above, and thereafter a Pd colloid is reacted with such a group to form a coordinate bond, Pd firmly attaches onto the surface since a chemical bond arises and therefore, the activation treatment can be performed while applying ultrasonic waves. In this case, even a blind hole with an aspect ratio as high as 1:4 or more and a diameter as small as 0.3 μm or less is treated with sufficient effectiveness and uniform plating can be attained even in a hole with an aspect ratio of 1:10 and a diameter of 0.18 μm.

Figure 8:
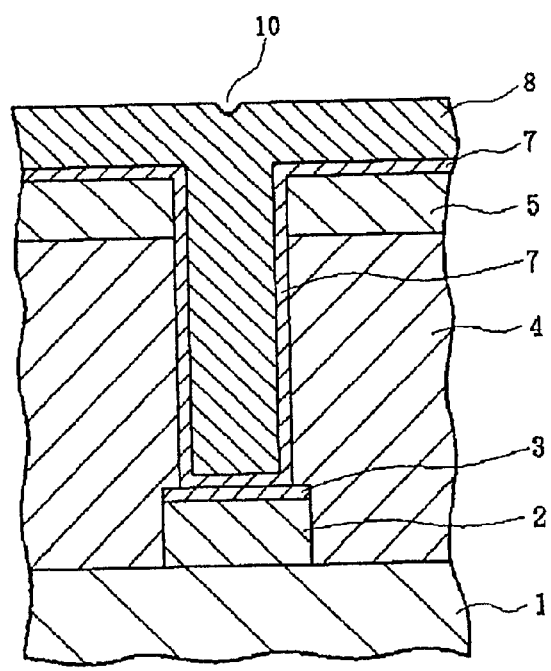
FIG. 8 is a sectional view schematically showing a further step of electroless plating according to the embodiment of the present invention.

The above described pretreatment is conducted in one cup and for the reason, a spin cup apparatus as shown in FIGS. 10 and 11 in which many kinds of treatment can be performed is preferred, whereas a dipping bath type as shown in FIG. 8 can be used as well.

The above described pretreatment for electroless plating can be applied for not only an interconnection process for a semiconductor wafer as described above, but a surface treatment for a metal or an inorganic object of every kind, which enables strong, precise plating with a high coating capability to be realized with no physical surface roughening treatment applied.

In this case, an electroless plating liquid including the following compounds is desirably employed: a salt of copper or nickel; an amphoteric ion type chelating agent such as glycin; a chelating agent in the form of an ammonium salt such as ammonium succinate; a reducing agent such as ammonium hypophosphite; and a non-ionic type surfactant, a cationic surfactant, and an anionic surfactant in the form of an ammonium salt. That is, in order to prepare an electroless plating liquid, a salt of copper or nickel; an amphoteric ion type chelating agent such as glycin; and a chelating agent in the form of an ammonium salt such as ammonium succinate and ammonium malic acid are mixed and pH of the mixture is adjusted by adding aqueous ammonia, and the resultant mixture is further mixed with a reducing agent including no alkali metal ion such as ammonium hypophosphite, hypophosphorous acid, ammonium borohydride, hydrazine and formalin and further with as a surfactant, a non-ionic type surfactant; a cationic surfactant; and an anionic surfactant in the form of an ammonium salt.

As described above, a chelating agent, a reducing agent (as ammonium hypophosphite), and a surfactant (as an anionic surfactant in the form of an ammonium salt) are in the forms of an ammonium salt and pH is adjusted using aqueous ammonia and a desirable composition of an electroless plating liquid is as follows:

copper chloride or nickel chloride: 10 to 100 g/l (copper sulfate, nickel sulfate, copper sulfamate or nickel sulfamate may be used instead)

gycin: 2 to 50 g/l (another amphoteric ion type chelating agent such as other amino acids may be used instead)

ammonium succinate: 2 to 50 g/l (ammonium salts such as ones of malic acid, succinic acid, malonic acid and formic acid may be used instead)

ammonium hypophosphite: 2 to 50 g/l (hypophosphorous acid, formalin, hydrazine, ammonium borohydride and the like may be used instead)

aqueous ammonia: 5 to 200 ml/l (pH is adjusted to a necessary value in the range of 6 to 12)

ammonium lauryl sulfate: 0.1 to 20 mg/l (a cationic surfactant is used when pH is acidic, an anionic surfactant when pH is basic and a non-ionic surfactant when pH is either acidic or basic)

In such a manner, it is desired to use an electroless plating liquid added with a salt of a catalytic metal such as nickel, cobalt, palladium and gold which serve as a plating reaction accelerator in an amount of 10 ppm or more.

Figure 12:
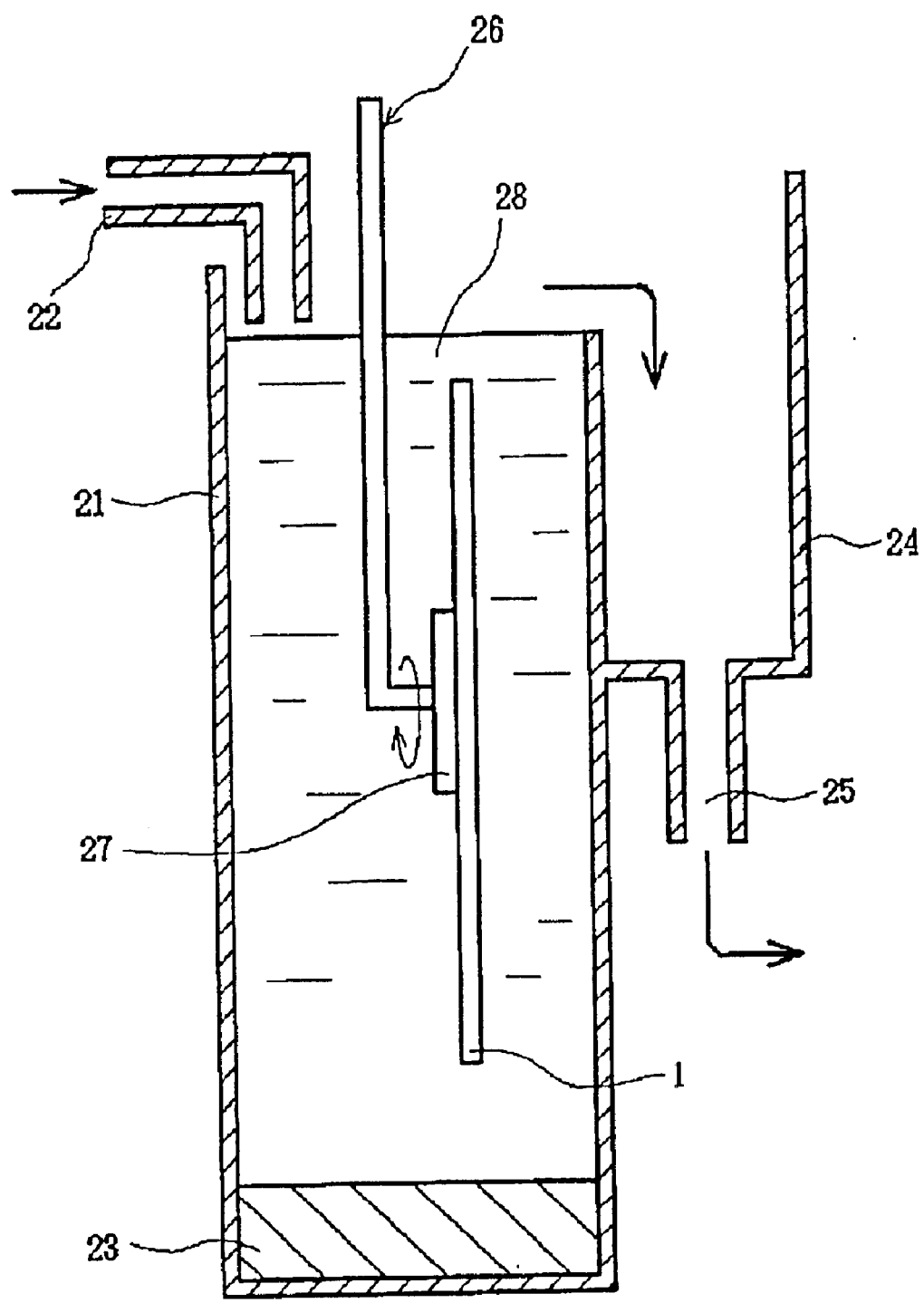
FIG. 12 is a sectional view schematically showing still another example of an apparatus for electroless plating according to the embodiment of the present invention.

Further, a treatment in a wet state is desirably performed under an influence of ultrasonic waves during the above described steps. In order to make the wet treatments effective, each wet treatment is desirably effected as follows: the apparatus of a spin cup type shown in FIGS. 10 and 11 or the apparatus of a dipping bath type shown in FIG. 12 is used, each step described above is conducted in one chamber, a treatment liquid is distributed over a plating object while rotating the object, or alternatively the object is dipped in the treatment liquid and the object is heated at a predetermined temperature. With the apparatuses in use, each step is made possible to be performed and in such a way, a series of steps including a pretreatment and electroless plating can be implemented. FIGS. 10 and 11 are schematic views of the same apparatus. In the apparatus, a turn table 15 that is supported on a shaft 14 and in which a heater is embedded is provided in a cup 13, a predetermined liquid is supplied to a wafer (which indicates a wafer in a fabrication stage of an integrated circuit in FIGS. 10 to 12) 1 that is held on the turn table 15 through a nozzle 18 (18a indicates a water cleaning nozzle that can be changed over to $O_3$, 18b a hydroxylation nozzle, 18c a coupling nozzle, 18d a Pd colloidal catalyst nozzle and 18e an activation liquid nozzle) disposed above the wafer 1, and a cleaning water is further supplied from a rear-surface water cleaning nozzle 19 disposed below the wafer. Further, an air pressure caused by rotation of the turn table 15 is discharged from an exhaust port 17, and cleaning water supplied and others are discharged from a drainage port 16. FIG. 10 shows a pretreatment process and arrow marks below the respective nozzles 18a to 18e indicate supply of treatment liquids through the nozzles 18a to 18e in respective steps. FIG. 11 shows an electroless plating step and a reference mark 18a indicates a warm pure water nozzle, 18b an electroless plating liquid nozzle and arrow marks below the nozzles indicate supply of treatment liquids in the respective steps. Further, in order to enable effective electroplating to be performed, a heater 20 embedded in the turn table 15 is controlled in the range of 30 to 90° C. so as to supply a heated plating liquid.

Further, FIG. 12 is a schematic view of a dipping bath type apparatus and in the apparatus, a treatment liquid 28 is supplied from a pipe 22 into a dipping bath 21 that is provided with an ultrasonic vibrator 23 at the bottom thereof. An overflowing liquid 28 once flows down in a receiver 24 as shown with an arrow and then is discharged from a drainage port 25. A wafer 1 is held on a wafer holding section 27 of a right-angle rotary mechanism 26 and dipped in the treatment liquid 28, wherein a predetermined treatment liquid 28 is supplied according to each step to perform the corresponding predetermined treatment.

Figure 7:
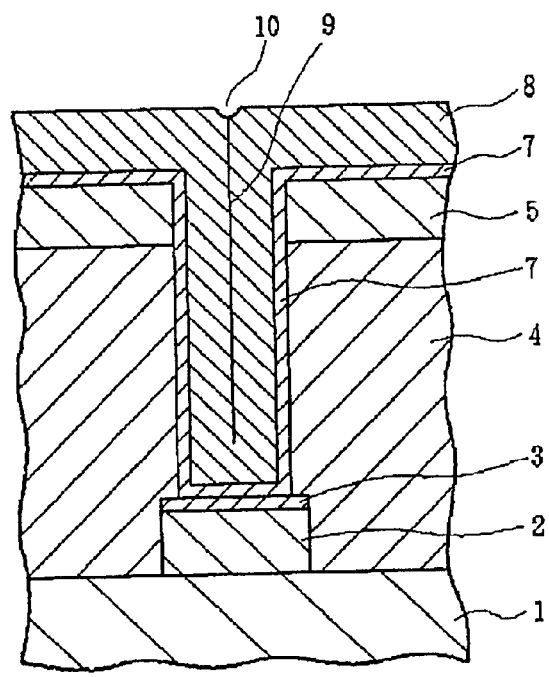
FIG. 7 is a sectional view schematically showing still another step of electroless plating according to the embodiment of the present invention.

Both of the apparatuses can be used broadly in the range of temperature from room temperature to 90° C., though depending on a value of pH. The liquids are very stable in all the temperature range and do not decompose in all the temperature range. In order not to contaminate each treatment liquid, the spin cup which can be sealed is desirably employed. However, if the top of the dipping bath is sealed with a film or the like stuck on the top, the dipping bath can be used while preventing a treatment liquid from being contaminated. In both types, ultrasonic waves are desirably utilized and while a wavelength may be arbitrary, a high frequency of 1 MHz or higher is desirably used since a diameter of a blind hole is as small as 1 μm or less. In the process, a cleaning water or a circulated water with 1% or less dissolved oxygen in content is desirably used after each step. That is, oxidation of a plating film is prevented from occurring and a high electric conductivity can be maintained by using the cleaning water and the circulated water with dissolved oxygen in content of 1% or less. Further, a baking treatment is desirably applied after electroless plating. That is, since crystals in an electroless plating film is small in size and further, there arises a closed seam 9 in a plating region in a hole as shown in FIG. 7, though no void occurs therein, the baking treatment is effected at 300 to 500° C. in an inactive gas atmosphere or vacuum so that the seam 9 can be erased as shown in FIG. 8.

By means of the above described method and apparatus for plating, the plating can be performed in a case where a diameter of the hole is 0.25 μm or less and an aspect ratio is 5 or higher and as actual results, a case where a diameter of the hole is 0.13 μm and an aspect ratio is 10 or higher has been established, which suggests a possibility that a hole with a smaller diameter and a higher aspect ratio is electrolessly plated with success.

According to the embodiment described above, a uniform, rigid electroless plating film can be formed throughout its entire surface on a barrier layer such as a layer made of Ti or a compound thereof, Ta or a compound thereof, or the like with neither a physical surface roughening treatment nor a high temperature heat treatment, and a high quality plating film of low oxygen content can be obtained in a blind hole in a state in which no void arises in company with a seam, the seam is erased by a heat treatment after the plating and a high degree of crystallinity is ensured.

Further, an OH group on the surface of a wafer or the like forms a chemical bond (covalent bond) with a silane coupling agent or a titanate coupling and a Pd particle forms a chemical bond (coordinate bond) with the surface. Therefore, an adhesive force of the electroless plating film to the surface is strong in principle and not only activation but electroless plating can be effected using ultrasonic waves with no bubble generation in the treatment liquids, which has conventionally been impossible to be done.

Consequently, an electroless plating film can be formed in a blind hole 0.25 μm or less in diameter and 5 or higher in aspect ratio using copper or nickel.

Figure 9:
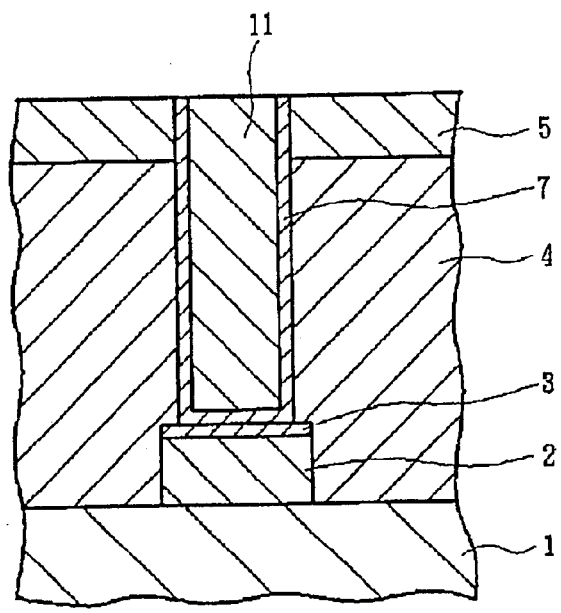
FIG. 9 is a sectional view schematically showing still a further step of electroless plating according to the embodiment of the present invention.

Further, a film with a uniform thickness across the surface can be formed on wafers of either 8 and 12 inch in diameter as well. Since the surface of a wafer after the plating has a recess as small as 0.1 μm or less in depth at the top of a blind hole when a plating film thickness is, for example, 0.5 μm, a CMP process in the next step can be conducted with ease as shown in FIG. 9.

It should be noted that a method for electroless plating of the present invention is excellent in thickness uniformity and fine feature coverage of a plating film and such a feature is the result of various contrivances described above, which has not been obtainable by simply employing a conventional electroless plating technique. That is, in the case of simply employing a conventional electroless plating technique, the surface roughening is not effected and a Pd catalyst does not adhere to a flat surface sufficiently with the result that the plating is not successful since an adhesive force is weak. In addition to such an inconvenience, fine bubbles generate as a result of a side reaction during the electroless plating, which makes the conventional technique not suitable for plating in a small blind hole. Furthermore, since alkali metal ions such as Na are included in salts of organic acids used as a chelating agent for electroless plating, a reducing agent and a pH adjusting liquid, the conventional technique is not suitable for a semiconductor process. In a method for electroless plating of the present invention, it is apparent that none of the above described faults occur.

It should be noted that the embodiment is possible to be altered in various ways based on a technical concept of the present invention.

For example, oxidizing agents, reducing agents, and other treatment liquids are not limited to those described above, but each of them can be replaced one with an equivalent capability. Further, an apparatus for plating is not limited to those shown in FIGS. 10 and 12 but the apparatuses can be replaced with equivalents in terms of performance. Further, an object of electroplating is not limited to a dual Damascene interconnect structure and a single Damascene interconnect structure used in an integrated circuit on a semiconductor wafer, but can be applied to various other kinds of interconnection and in addition, to all other plating items.

As described above, according to the present invention, when at least a hole like a blind hole is plated as a plating region, organic material existent on the plating region is removed and the surface is hydrophilized, then a catalytic metal is bonded with a coupling agent that is bonded with the surface, and the catalytic metal is exposed to activate, which is followed by electroless plating on the surface. Hence, according to the electroless plating, uniform plating is effected at the mouth and on the bottom and sidewall while no seed layer is required, which makes the electroless plating of the present invention different from a conventional electroplating. For the reasons, a uniform, good quality plating film can be achieved not only on a flat surface but in a hole with a high aspect ratio, wherein the top part of the hole can be filled with a plating layer of a high flatness. Accordingly, since polishing after the plating is easy to be conducted and direct electroless plating can be effected with neither physical surface roughening nor a heat treatment, a method for plating and a plating structure with high productivity can be provided.

What is claimed is:

1. A method for plating in which at least a hole is plated with a metal, comprising:

a first step of removing organic material existent in a plating region;

a second step of hydrophilizing a surface of the plating region after the first step;

a third step of bonding a coupling agent with the surface hydrophilized by the second step;

a fourth step of bonding a catalytic metal with the coupling agent at the surface after the third step;

a fifth step of exposing the catalytic metal to activate after the fourth step; and a sixth step of electrolessly plating the activated surface after the fifth step, wherein:

a barrier layer is formed on a surface of at least the hole and thereafter, the surface is oxidized to remove the organic material;

following removal of the organic material, the surface is hydroxylated by treating with an oxidizing agent;

following the hydroxylation, a silane coupling agent or a titanate coupling agent having an atom or an atomic group that forms a coordinate bond with a metal component in a protective agent for a colloid of the catalytic metal is made to react with the hydroxylated surface;

following the hydroxylation, the surface is treated with the colloidal solution of the catalytic metal and thereby, the metal component in the protective agent for the colloid of the catalytic metal is reacted with a functional group of the silane coupling agent or the titanate coupling agent to form a coordinate bond;

following the treatment with the colloidal solution, the protective agent in excess that does not form the coordinate bond is removed to perform an activation treatment in which the catalytic metal is exposed; and following the activation treatment, the surface that has received the activation treatment is treated with an electroless plating liquid including a chelating agent and a reducing agent containing no alkali metal and thereby, electroless plating with copper or nickel is effected on the surface.

2. A method for plating according to claim 1, wherein a tin atom of stannous chloride, which is a protective agent of a palladium colloid, is reacted with an amino group or a thiol group in the silane coupling agent, or the titanate coupling agent, to form a coordinate bond and bond the palladium colloid with the surface by a treatment with a palladium colloidal solution protected by stannous chloride.

3. A method for plating according to claim 1, wherein an electroless plating liquid including a salt of copper or nickel; an amphoteric ion type chelating agent that includes glycin; a chelating agent in the form of an ammonium salt that includes ammonium succinate; a reducing agent that includes ammonium hypophosphite; and a non-ionic surfactant, a cationic surfactant, and an anionic surfactant in the form of an ammonium salt is used.

4. A method for plating according to claim 3, wherein the electroless plating liquid added with a salt of a catalytic metal that includes nickel, cobalt, palladium and gold which serve as a plating reaction accelerator in an amount of 10 ppm or more is used.

5. A method for plating according to claim 1, wherein a treatment conducted at least in a wet state in all of the steps is effected under influence of ultrasonic waves.

6. A method for plating according to claim 1, wherein a surface of a barrier layer made of titanium, tantalum and compounds thereof is hydroxylated with an oxidizing agent to form an hydroxyl group on the surface.

7. A method for plating according to claim 6, wherein the oxidizing agent includes an aqueous sulfuric acid/hydrogen peroxide mixture, hypochlorous acid, an aqueous solution of ammonia, ammonium permanganate, an ozone/water mixture or the like.

8. A method for plating according to claim 1, wherein cleaning water and circulated water with 1% or less dissolved oxygen in content is used in cleaning after all the steps.

9. A method for plating according to claim 1, wherein a baking treatment is applied after the electroless plating.

10. A method for plating according to claim 1, wherein all the steps are affected in one chamber.

11. A method for plating according to claim 1, wherein a treatment liquid is distributed across a plating object while rotating the object, or alternatively the object is dipped in the treatment liquid.

12. A method for plating according to claim 11, wherein the object is heated at a predetermined temperature.

13. A method for plating according to claim 1, wherein a diameter of the hole is 0.25 $\mu$m or less and an aspect ratio thereof is 5 or higher.

14. A method for plating according to claim 1, wherein the organic material on the surface of the plating region is removed by an oxidation treatment, dry or/and wet, using an oxidizing agent.

15. A method for plating according to claim 14, wherein the dry oxidation treatment includes an ozone treatment under ultraviolet irradiation, a plasma ashing treatment, while the wet oxidation treatment includes oxidation with an ozone/water mixture.

16. A method for plating in which at least a hole is plated with a metal, comprising:

a first step of removing organic material existent in a plating region;

a second step of hydrophilizing a surface of the plating region after the first step;

a third step of bonding a coupling agent with the surface hydrophilized by the second step;

a fourth step of bonding a catalytic metal with the coupling agent at the surface after the third step;

a fifth step of exposing the catalytic metal to activate after the fourth step; and a sixth step of electrolessly plating the activated surface after the fifth step, wherein the organic material on the surface of the plating region is removed by an oxidation treatment, dry or/and wet, using an oxidizing agent.

17. A method for plating according to claim 16, wherein the dry oxidation treatment includes an ozone treatment under ultraviolet irradiation, and a plasma ashing treatment, while the wet oxidation treatment includes oxidation with an ozone/water mixture.

18. A method for plating according to claim 16, wherein:

a barrier layer is formed on a surface of at least the hole and thereafter, the surface is oxidized to remove the organic material;

following removal of the organic material, the surface is hydroxylated by treating with an oxidizing agent;

following the hydroxylation, a silane coupling agent or a titanate coupling agent including an atom or an atomic group that is easy to form a coordinate bond with a metal component in a protective agent for a colloid of the catalytic metal is made to react with the hydroxylated surface;

following the hydroxylation, the surface is treated with the colloidal solution of the catalytic metal and thereby, the metal component in the protective agent for the colloid of the catalytic metal is reacted with a functional group of the silane coupling agent or the titanate coupling agent to form a coordinate bond;

following the treatment with the colloidal solution, the protective agent in excess that does not form the coordinate bond is removed to perform an activation treatment in which the catalytic metal is exposed; and following the activation treatment, the surface that has received the activation treatment is treated with an electroless plating liquid including a chelating agent and a reducing agent containing no alkali metal and thereby, electroless plating with copper or nickel is effected on the surface.

19. A method for plating according to claim 18, wherein a tin atom of stannous chloride, which is a protective agent of a palladium colloid, is reacted with an amino group or a thiol group in the silane coupling agent, or the titanate coupling agent, to form a coordinate bond and bond the palladium colloid with the surface by a treatment with a palladium colloidal solution protected by stannous chloride.

20. A method for plating according to claim 18, wherein an electroless plating liquid including a salt of copper or nickel; an amphoteric ion type chelating agent that includes glycin; a chelating agent in the form of an ammonium salt that includes ammonium succinate; a reducing agent that includes ammonium hypophosphite; and a non-ionic surfactant, a cationic surfactant, and an anionic surfactant in the form of an ammonium salt is used.

21. A method for plating according to claim 20, wherein the electroless plating liquid added with a salt of a catalytic metal that includes nickel, cobalt, palladium and gold which serve as a plating reaction accelerator in an amount of 10 ppm or more is used.

22. A method for plating according to claim 16, wherein a treatment conducted at least in a wet state in all of the steps is effected under influence of ultrasonic waves.

23. A method for plating according to claim 16, wherein a surface of a barrier layer made of titanium, tantalum and compounds thereof is hydroxylated with an oxidizing agent to form an hydroxyl group on the surface.

24. A method for plating according to claim 23, wherein the oxidizing agent includes an aqueous sulfuric acid/ hydrogen peroxide mixture, hypochlorous acid, an aqueous solution of ammonia, ammonium permanganate, an ozone/ water mixture or the like.

25. A method for plating according to claim 16, wherein cleaning water and circulated water with 1% or less dissolved oxygen in content is used in cleaning after all the steps.

26. A method for plating according to claim 16, wherein a baking treatment is applied after the electroless plating.

27. A method for plating according to claim 16, wherein all the steps are affected in one chamber.

28. A method for plating according to claim 16, wherein a treatment liquid is distributed across a plating object while rotating the object, or alternatively the object is dipped in the treatment liquid.

29. A method for plating according to claim 28, wherein the object is heated at a predetermined temperature.

30. A method for plating according to a claim 16, wherein a diameter of the hole is 0.25 $\mu$m or less and an aspect ratio thereof is 5 or higher.

* * * * *